(12) United States Patent
Byrne et al.

(10) Patent No.: US 9,392,869 B2
(45) Date of Patent: Jul. 19, 2016

(54) CLAMP FOR SURFACE-MOUNTED DEVICES

(71) Applicants: Norman R. Byrne, Ada, MI (US); Thomas A. Petersen, Sand Lake, MI (US)

(72) Inventors: Norman R. Byrne, Ada, MI (US); Thomas A. Petersen, Sand Lake, MI (US)

(*) Notice: Subject to any disclaimer, the term of this patent is extended or adjusted under 35 U.S.C. 154(b) by 0 days.

(21) Appl. No.: 14/707,568

(22) Filed: May 8, 2015

(65) Prior Publication Data

US 2015/0320204 A1 Nov. 12, 2015

Related U.S. Application Data

(60) Provisional application No. 61/990,856, filed on May 9, 2014.

(51) Int. Cl.
| H05K 7/02 | (2006.01) |
| H05K 7/04 | (2006.01) |
| A47B 21/06 | (2006.01) |
| F16B 2/18 | (2006.01) |
| F16B 2/10 | (2006.01) |
| H05K 7/14 | (2006.01) |

(52) U.S. Cl.
CPC . *A47B 21/06* (2013.01); *F16B 2/10* (2013.01); *F16B 2/18* (2013.01); *H05K 7/1401* (2013.01); *A47B 2021/066* (2013.01); *Y10T 29/49948* (2015.01)

(58) Field of Classification Search
USPC ............... 361/759, 801–802; 248/176.1, 243, 248/918, 298.1, 309.1
See application file for complete search history.

(56) References Cited

U.S. PATENT DOCUMENTS

| 3,811,104 | A | * | 5/1974 | Caldwell | H01R 13/6395 439/135 |
| 4,551,577 | A | | 11/1985 | Byrne | |
| 4,747,788 | A | | 5/1988 | Byrne | |
| 5,337,998 | A | * | 8/1994 | Nemoto | G11B 33/08 248/634 |
| 5,575,668 | A | | 11/1996 | Timmerman | |
| 5,709,156 | A | | 1/1998 | Gevaert et al. | |
| 6,290,518 | B1 | | 9/2001 | Byrne | |
| 6,520,792 | B2 | * | 2/2003 | Chen-Chiang | H01R 13/6395 439/373 |
| 6,657,868 | B1 | * | 12/2003 | Hsue | G11B 33/128 174/138 G |
| 7,495,905 | B2 | * | 2/2009 | Peng | G06F 1/187 312/223.1 |
| 8,107,257 | B2 | * | 1/2012 | Moorehead, Jr. | H05K 7/1412 361/801 |
| 8,295,036 | B2 | | 10/2012 | Byrne | |
| 8,690,590 | B2 | | 4/2014 | Byrne | |
| 8,721,124 | B2 | | 5/2014 | Byrne et al. | |
| 8,987,642 | B2 | | 3/2015 | Byrne | |
| 2004/0075373 | A1 | | 4/2004 | Gershfeld | |
| 2011/0067896 | A1 | * | 3/2011 | Baldwin | H02G 3/123 174/58 |

* cited by examiner

*Primary Examiner* — Hung S Bui
(74) *Attorney, Agent, or Firm* — Gardner, Linn, Burkhart & Flory, LLP (57) ABSTRACT

A clamp is provided for securing a device at an opening formed in a mounting surface, such as a table, desk, wall panel, or the like. The clamp includes a substantially vertical member with upper and lower portions, an outwardly extending member that projects outwardly from the vertical member, and an adjustable clamp member that is mounted to the outwardly-extending leg and can be tightened or loosened for installing or removing the clamp. The upper portion of the vertical member engages an interior surface of the mounting surface, while another projection extends from the vertical member and engages a sidewall of the device being secured to the mounting surface.

20 Claims, 9 Drawing Sheets

CLAMP FOR SURFACE-MOUNTED DEVICES

CROSS REFERENCE TO RELATED APPLICATION

The present application claims the benefit of U.S. provisional application Ser. No. 61/990,856, filed May 9, 2014, which is hereby incorporated by reference in its entirety.

FIELD OF THE INVENTION

The present invention relates to mounting hardware for electrical power and/or data units that are mountable at, in, or along a work surface such as a table, desk, wall divider, or the like.

BACKGROUND OF THE INVENTION

Electrical power and/or data units and other devices are commonly located at or near work surfaces, such as tables, desks, wall panels, and the like. It is generally desirable to use some form of mounting hardware to secure the power unit in place at such a work surface.

SUMMARY OF THE INVENTION

The present invention provides a clamp for securing a surface-mounted device, such as power and/or data units, to work surfaces such as tables, desks, wall dividers, and the like. The clamp is particularly suited for securing such a device in an opening formed in a work surface, and may be installed or removed without use of tools. The clamp can be made relatively small and inexpensively, with as few as two different parts that are assembled together, and is compatible for use with many different sizes, shapes, and types of surface-mounted devices. Such devices may include, for example, an electrical power and/or electronic data and/or communications device, surface-mounted storage bin, surface-mounted lamp, or substantially any device that is desired for mounting in an opening formed in a surface, such as a generally planar work surface. Moreover, the clamp facilitates one-handed installation or removal, and is sufficiently easy to position, secure, or remove, so that these operations can be performed by feel (i.e. without visual reference) in locations that are normally obscured from view, such as along the underside of a table or behind a modular wall surface.

In one form of the present invention, a clamp for surface mounted devices includes a substantially vertical member, an outwardly-extending leg that projects laterally outwardly from the vertical member, and an adjustable clamp member that is movably coupled to the outwardly-extending leg. The vertical member has an upper portion and a lower portion, with the upper portion configured to engage a mounting surface such as a table, a desk, a modular wall panel, or the like. The upper portion of the vertical member extends above a lower surface of the mounting surface, and the lower portion of the vertical member engages the electrical power and/or data unit. The outwardly-extending leg is configured to be positioned below the lower surface of the mounting surface. The adjustable clamp member has a distal end portion located at or above the outwardly-extending leg, and a proximal end portion opposite the distal end portion. The distal end portion of the clamp member is configured to selectively engage the lower surface of the mounting surface, and the clamp member is tightenable so that its distal end portion engages the lower surface of the mounting surface to urge the outwardly-extending leg away from the lower surface, and to urge the lower portion of the vertical member into securing engagement with the electrical power and/or data unit. When the adjustable clamp member is tightened, the upper portion of the vertical member engages the mounting surface in a manner that substantially precludes sliding of the vertical member relative to the mounting surface, and in a manner that substantially precludes sliding of the lower portion of the vertical member relative to the electrical power and/or data unit, thereby securing the unit to the mounting surface.

In one aspect, the adjustable clamp member is a thumb screw with a gripping surface at the proximal end portion, with the gripping surface being located below the outwardly-extending leg. Optionally, the outwardly-extending leg defines a threaded bore and the clamp member includes a threaded shaft portion that is threadedly received in the bore of the outwardly-extending leg.

In another aspect, a unit-engaging projection extends inwardly from the vertical member, in an opposite direction of the outwardly-extending leg, and is configured to be received in an opening that is formed in a sidewall of the electrical power and/or data unit.

According to another form of the present invention, a method is provided for securing a power and/or data unit to a mounting surface, such as a table, a desk, or a modular wall panel. The method includes the steps of (i) positioning the power and/or data unit in an opening formed in the mounting surface, where the unit has a sidewall located adjacent an interior surface of the mounting surface, (ii) inserting an upper portion of a clamp into a space defined between the sidewall of the unit and the adjacent interior surface of the mounting surface, (iii) engaging an inwardly-directed projection of the clamp into an opening formed in the sidewall of the power and/or data unit, (iv) positioning an outwardly-extending leg of the clamp below a lower surface of the mounting surface, so that the outwardly-extending leg is below the upper portion of the clamp, and (v) tightening an adjustable clamp member, which is movably coupled to the outwardly-extending leg of the clamp, so that a distal tip portion of the adjustable clamp member engages the lower surface of the mounting surface, thus biasing the outwardly-extending leg away from the lower surface of the mounting surface, and biasing a lower portion of the clamp into engagement with the sidewall of the power and/or data unit.

In one aspect, the upper portion of the clamp is initially oriented at an insertion angle that is oblique to both the sidewall of the power and/or data unit and the lower surface of the mounting surface.

In another aspect, the step of engaging the inwardly-directed projection of the clamp into the opening that is formed in the sidewall includes pivoting or rotating the clamp from the oblique insertion angle to an orientation in which the upper portion of the clamp is substantially parallel to the sidewall and substantially perpendicular to the lower surfaced of the mounting surface.

Thus, the clamp of the present invention provides a relatively inexpensive and easy-to-use securing device for selectively attaching surface-mounted devices to other surfaces such as tables, desks, modular wall panels, or the like. The clamp can be used with substantially any device mounted to a surface, and can be readily installed or removed without the use of tools, and if desired, without the clamp or the installation area being visible to the installer.

These and other objects, advantages, purposes and features of the present invention will become apparent upon review of the following specification in conjunction with the drawings.

DESCRIPTION OF THE PREFERRED EMBODIMENTS

A clamp is provided for securing electrical power and/or data units, or similar surface-mountable devices, to a work surface such as a table, a desk, or a wall surface. The clamp is compatible for use with many different types of surface-mountable devices, such as electrical and/or electronic data units that are commonly mounted in work areas, such as along tables, desks, modular wall panels, and the like. The clamp can be readily positioned and installed in a single-handed operation, optionally without visual reference to the installation area. Typically, two or more clamps are used to secure a given device to a mounting surface, and the clamps may be readily removed and reused as desired, for the same or different devices. Moreover, the clamp can be used to secure devices to surfaces of different thicknesses.

Figures 1, 2:
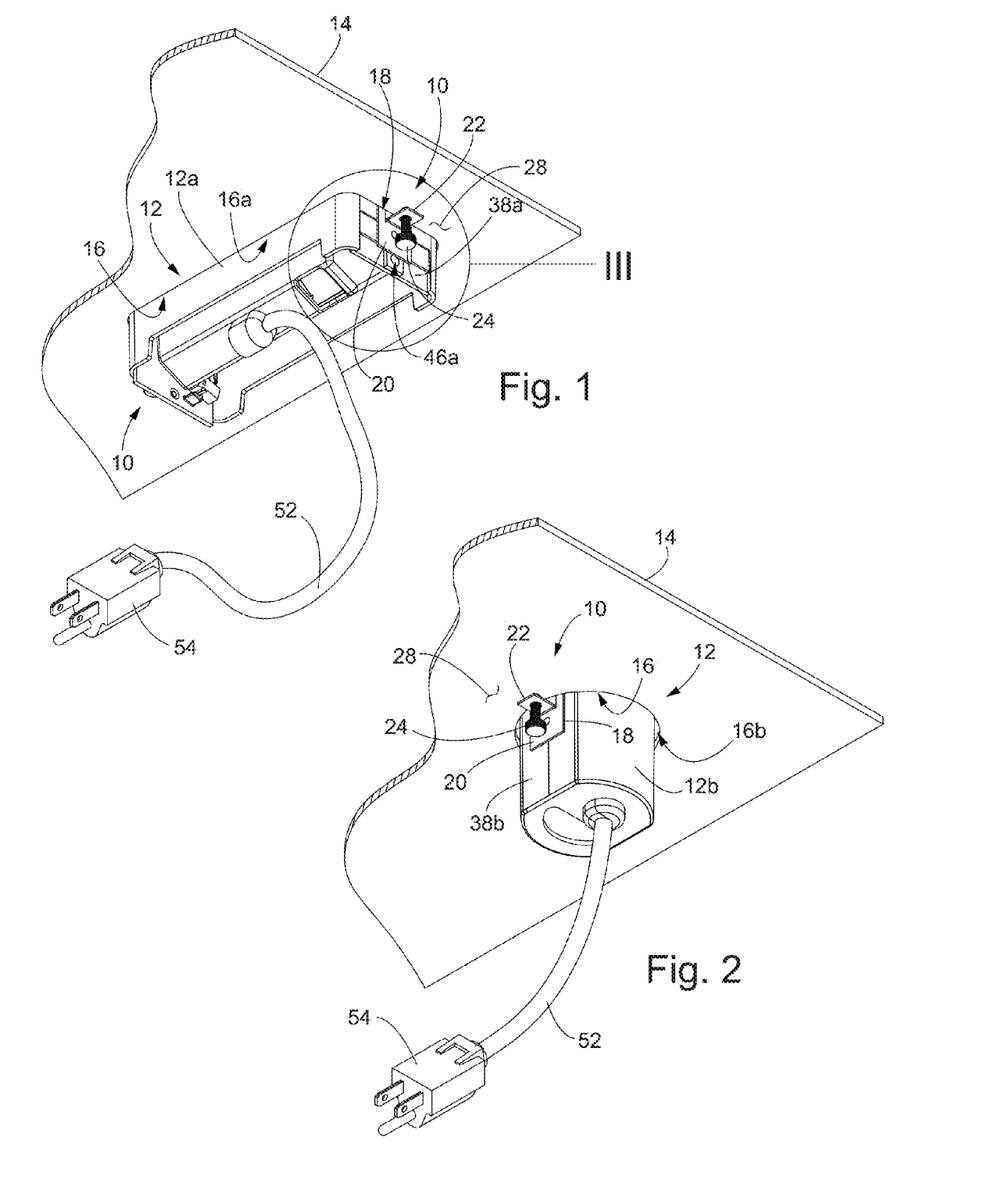
FIG. 1 is a bottom perspective view of an electrical unit mounted in an opening of a work surface using a pair of clamps in accordance with the present invention.
FIG. 2 is a bottom perspective view of another electrical unit mounted in an opening of a work surface using a pair of clamps in accordance with the present invention.

Referring now to the drawings and the illustrative embodiments depicted therein, a pair of clamps 10 is used to secure a device such as a power and/or data unit 12 to a work surface 14 (FIGS. 1 and 2). Clamps 10 are particularly well suited for securing devices 12 to respective openings 16 formed in work surfaces 14. As will be described in more detail below, respective portions of clamp 10 are biased into engagement with portions of work surface 14 and of device 12 during installation of clamp 10, to thereby secure device 12 in opening 16.

Throughout this specification, the terms "upper" or "top", "lower" or "bottom", "front", "back", "over" or "above", "under" or "below", "vertical", and "horizontal" may be used to denote relative directions and locations for convenience and with reference to the appended drawings. However, it will be appreciated and understood that such terms are used to facilitate clarity of the description, and should not be construed as limiting in any way. For example, a component described or claimed as being "vertical" may in fact be aligned horizontally depending on the particular installation or application.

Figure 3:
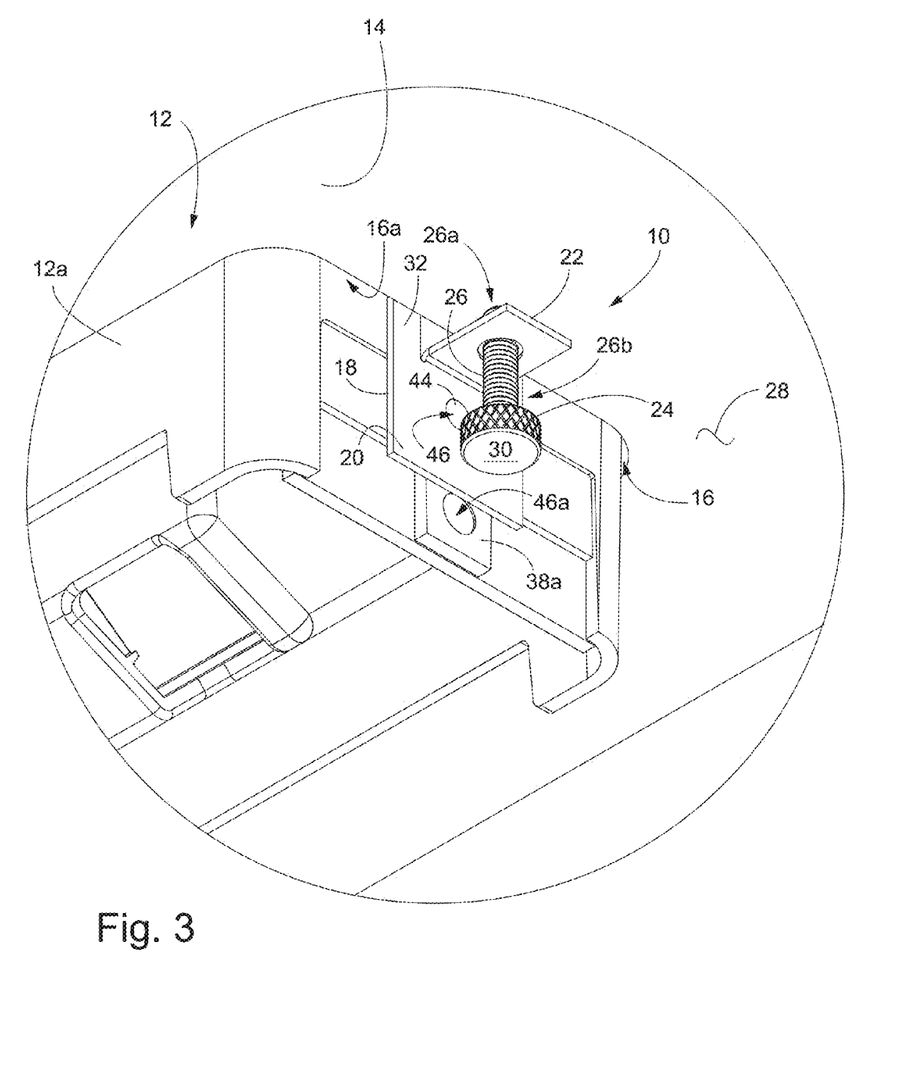
FIG. 3 is an enlarged view of the area designated III in FIG. 1.

Clamp 10 includes a body 18 having a vertical member or portion 20 and an outwardly-extending leg or portion 22 that projects outwardly from vertical portion 20, such as shown in FIGS. 1-4J and 7A-9B. An adjustable clamp member in the form of a thumb screw 24 is rotatably coupled to outwardly-extending leg 22. Thumb screw 24 includes a threaded shaft 26 with a distal end or tip portion 26a that engages a bottom surface 28 of work surface 14 near opening 16, such as shown in FIG. 3. A knob or gripping portion 30 is provided at a proximal end portion 26b of threaded shaft 26. Optionally, the knob or gripping portion may be formed with a tool-receiving surface, such as a straight or cross-point recess for receiving a common screwdriver, or a hexagonal or other polygonal outer surface for receiving a wrench or the like.

Vertical member 20 of body 18 includes an upper portion 20a and a lower portion 20b, such as shown in FIGS. 4A-4D and 4G-4J. In the illustrated embodiment, upper portion 20a includes a pair of substantially vertical projections 32 with an open space 34 defined therebetween. Vertical projections 32 are positionable in a space 36 that is defined between a sidewall 38 of device 12 and an interior surface 40 of work surface 14 that defines a portion of opening 16, such as shown in FIGS. 5A and 7A-8. Respective upper edges or corners 42 of vertical projections 32 engage interior surface 40 upon tightening of thumb screw 24, and may bite into interior surface 40 to limit or preclude sliding motion of upper corners 42 along the interior surface 40 of work surface 14.

Figure 4A:
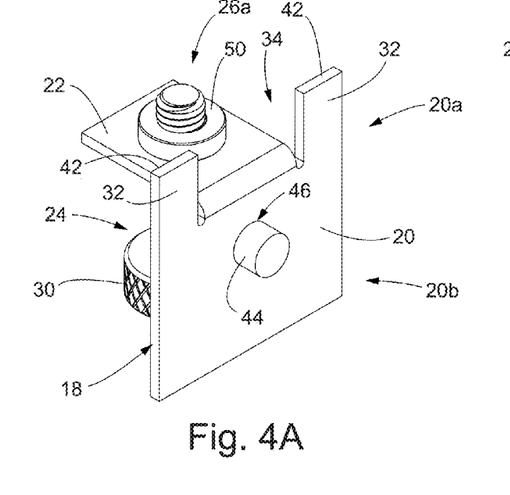
FIGS. 4A-4D are different perspective views of the clamp shown in FIGS. 1-3.
Figure 4B:
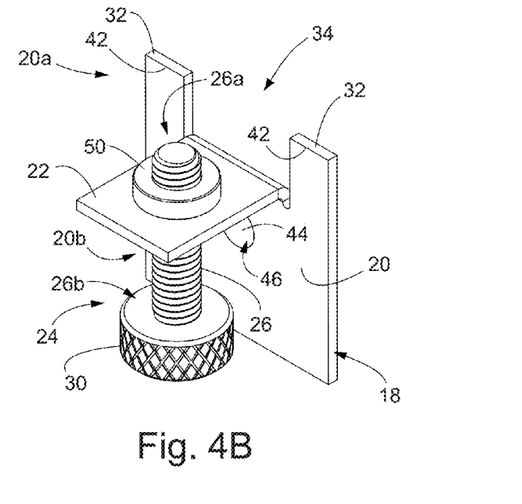
Figures 7A, 7B:
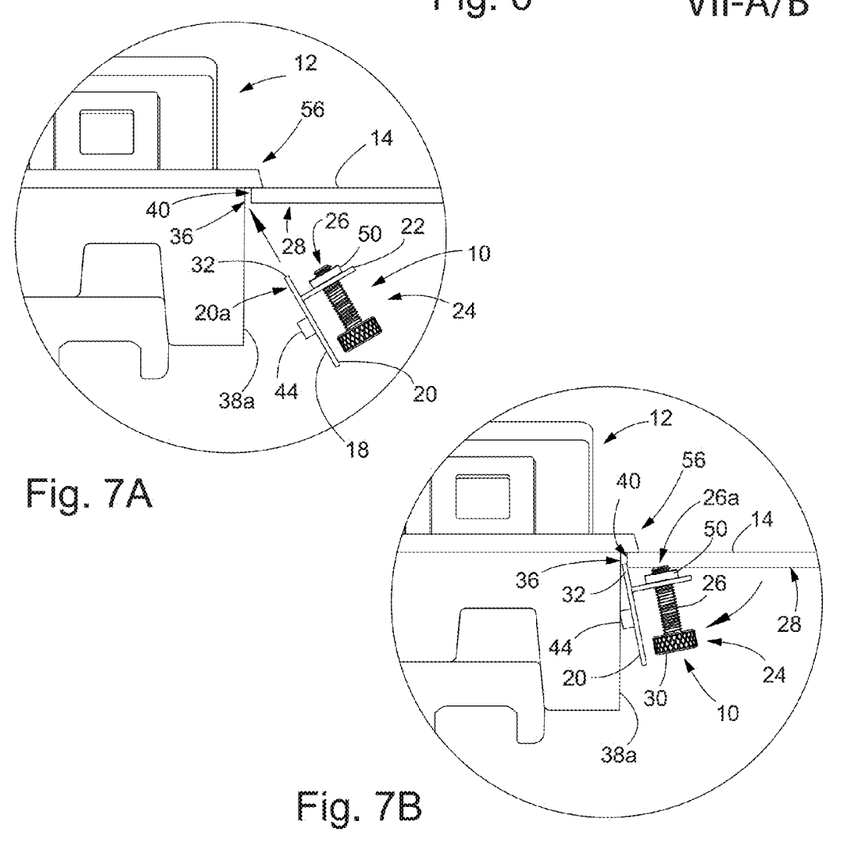
FIG. 7A is an enlarged view of the region designated VII-A/B in FIG. 6, and depicting initial insertion of an upper portion of the clamp.
FIG. 7B is another enlarged view of the region designated VII-A/B in FIG. 6, and depicting rotation of the clamp prior to full engagement of the clamp with the power unit and the work surface.
Figure 8:
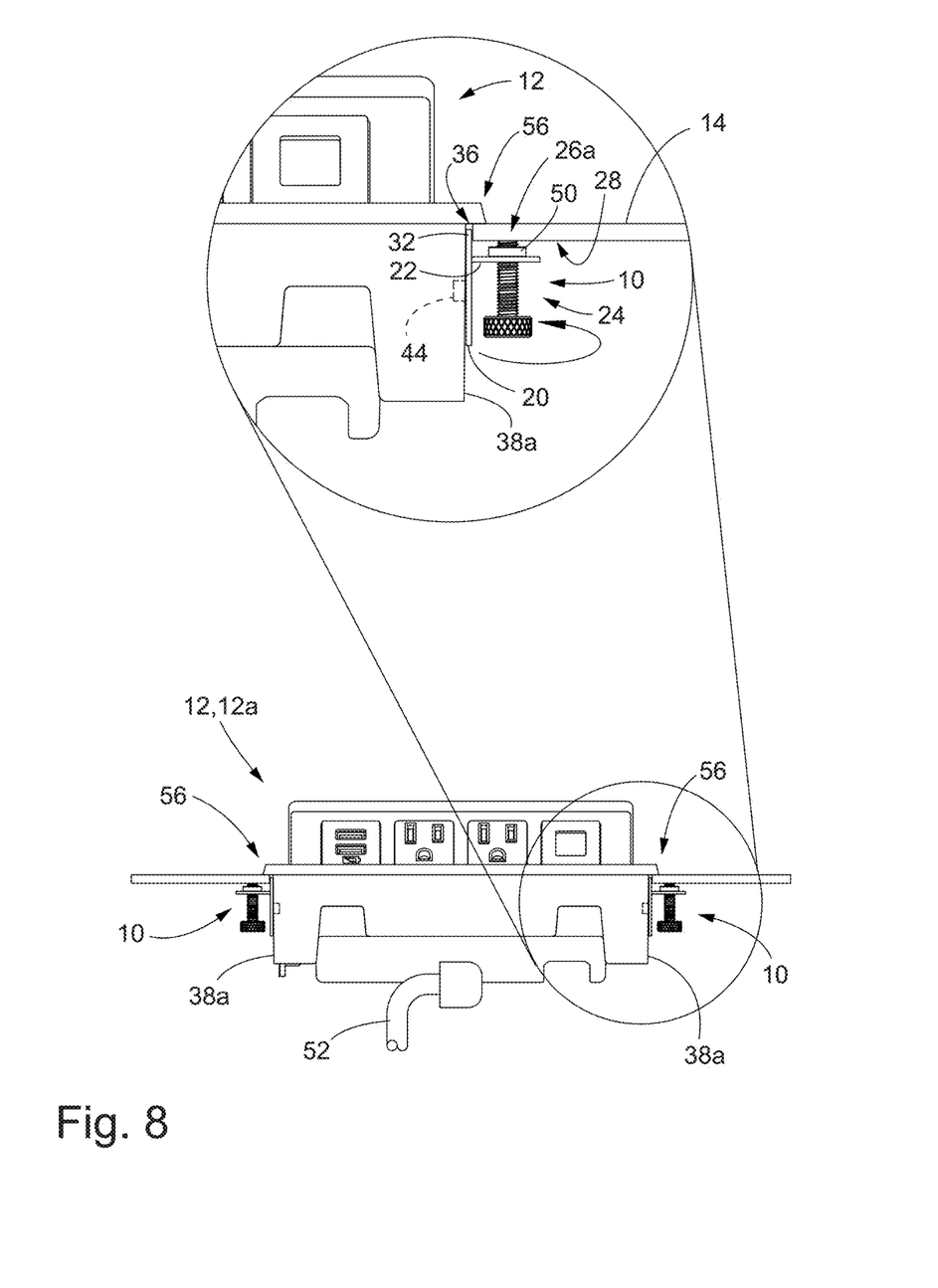
FIG. 8 is another side elevation of the electrical unit and work surface of FIG. 6 showing two clamps fully installed, including an enlarged view of a designated region thereof.
Figure 9A:
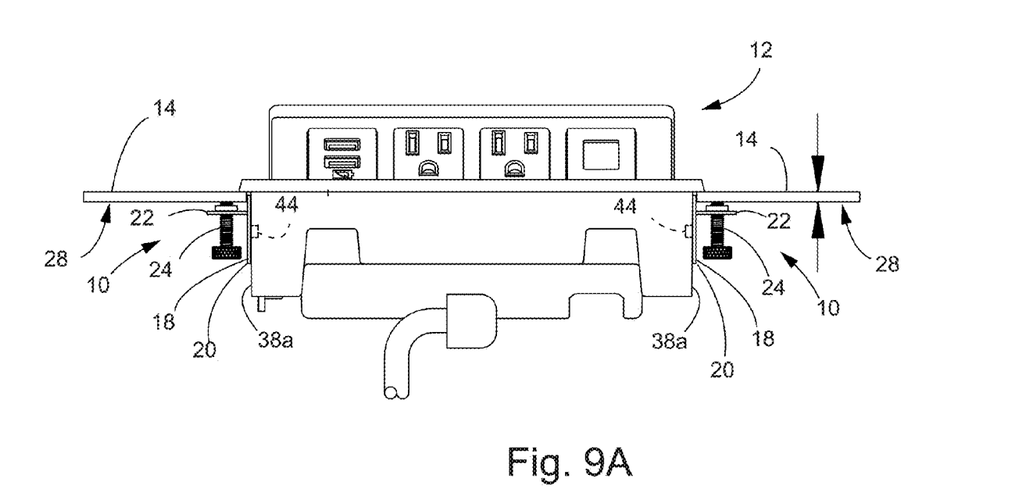
FIGS. 9A and 9B are side elevations of the power unit secured with two clamps along relatively thinner and relatively thicker work surfaces, respectively.
Figure 9B:
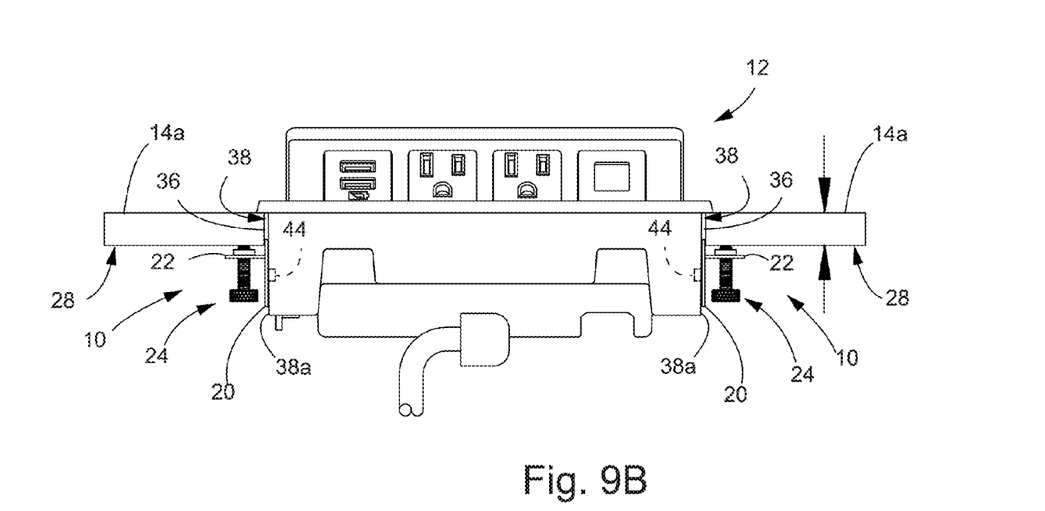

A unit-engaging projection 44 extends inwardly from vertical member 20, in a direction opposite that of outwardly-extending leg 22, such as shown in FIGS. 4A, 4D, 4I, 4J, and 7A-8. Projection 44 may be substantially cylindrical in shape, such as shown, or it may be substantially any other desired shape that is sized and positioned appropriately along vertical member 20 so as to be received in an opening or bore 46, 46A that is formed or established in sidewall 38 of device 12, such as shown in FIGS. 5A and 5B (and which may also be understood with reference to FIGS. 8-9B). Projection 44 may be unitarily formed with vertical member 20, such as via a stamping operation, or may be a separate cylindrical member that is received in a bore 48 that is formed or established in vertical member 20, such as shown in FIGS. 4A-4D and 4H. Thus, when clamp 10 is fully installed, such as shown in FIGS. 8-9B, projection 44 is seated in the opening 46 formed in sidewall 38 of device 12, with vertical member 20 lying against (or in close proximity to) sidewall 38, while the engagement of projection 44 in opening 46 limits or precludes sliding movement of vertical member 20 relative to sidewall 38. Other types of engaging surfaces are envisioned for limiting or preventing relative movement between the clamp's vertical member and the power and/or data unit, such as a ratcheting surface and pawl arrangement, or an opening or recess formed in the vertical member for receiving a projection associated with the sidewall, for example.

Outwardly-extending leg 22 is unitarily formed with vertical member 20, and these may be made or formed from a single piece of sheet metal or any other sufficiently strong and resilient material, including resinous plastics and fiber-reinforced resinous plastics. For example, a single rectangular piece of sheet metal may be formed by cutting slots between what will become the substantially vertical projections 32, and what will become outwardly-extending leg 22, and then bending the leg 22 at the angle shown, so as to be substantially perpendicular to vertical member 20. However, it will be appreciated that outwardly-extending leg 22 could be set at other angles relative to vertical member 20, without departing from the spirit and scope of the present invention.

Figure 4C:
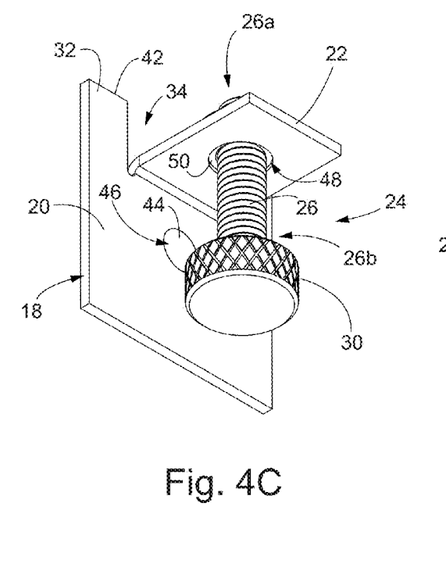
Figure 4D:
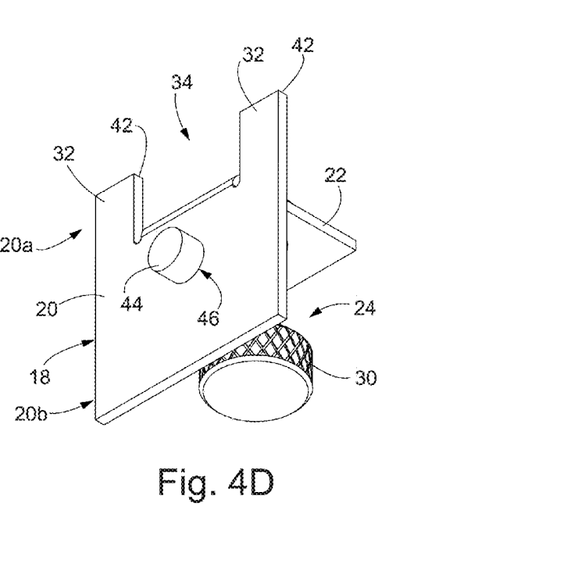
Figure 4E:
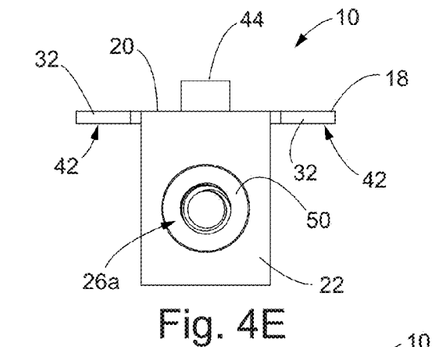
FIG. 4E is a top plan view of the clamp.
Figure 4F:
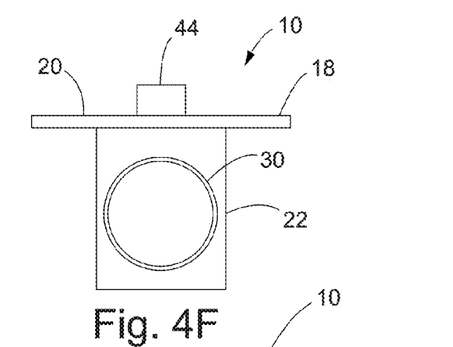
FIG. 4F is a bottom plan view of the clamp.
Figure 4G:
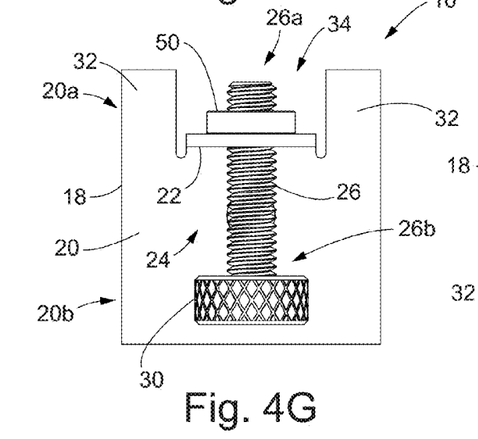
FIG. 4G is a front or outboard elevation of the clamp.
Figure 4H:
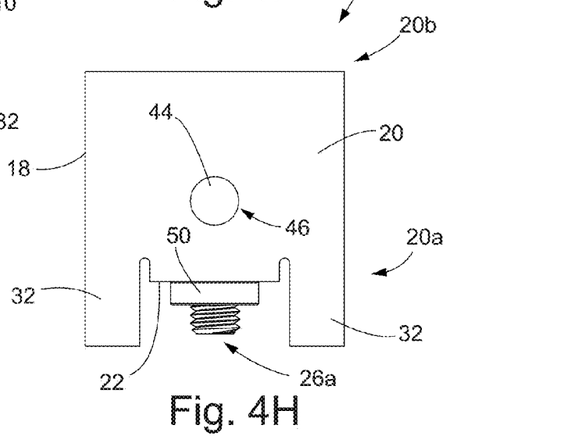
FIG. 4H is a rear or inboard elevation of the clamp.
Figure 4I:
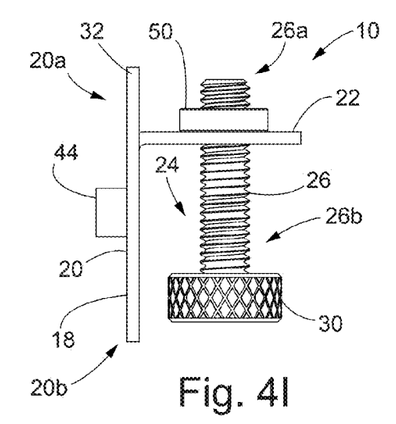
FIG. 4I is a right side elevation of the clamp.
Figure 4J:
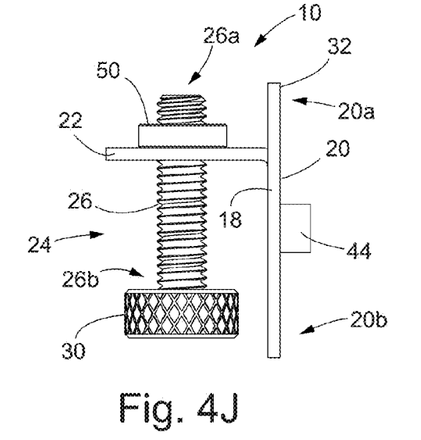
FIG. 4J is a left side elevation of the clamp.
Figure 5A:
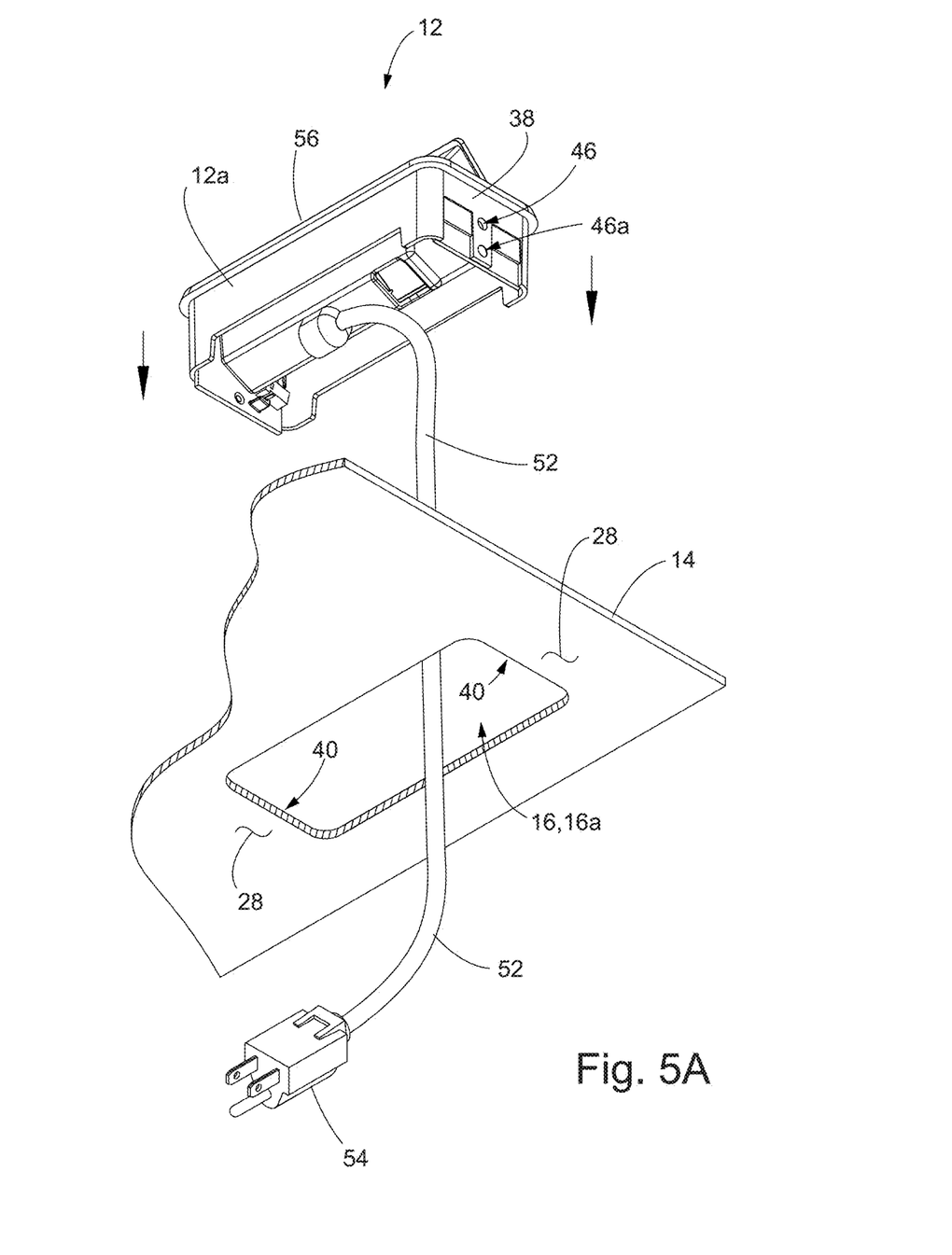
FIG. 5A is a bottom perspective view of the power unit of FIG. 1 being positioned in an opening formed in a work surface.
Figure 5B:
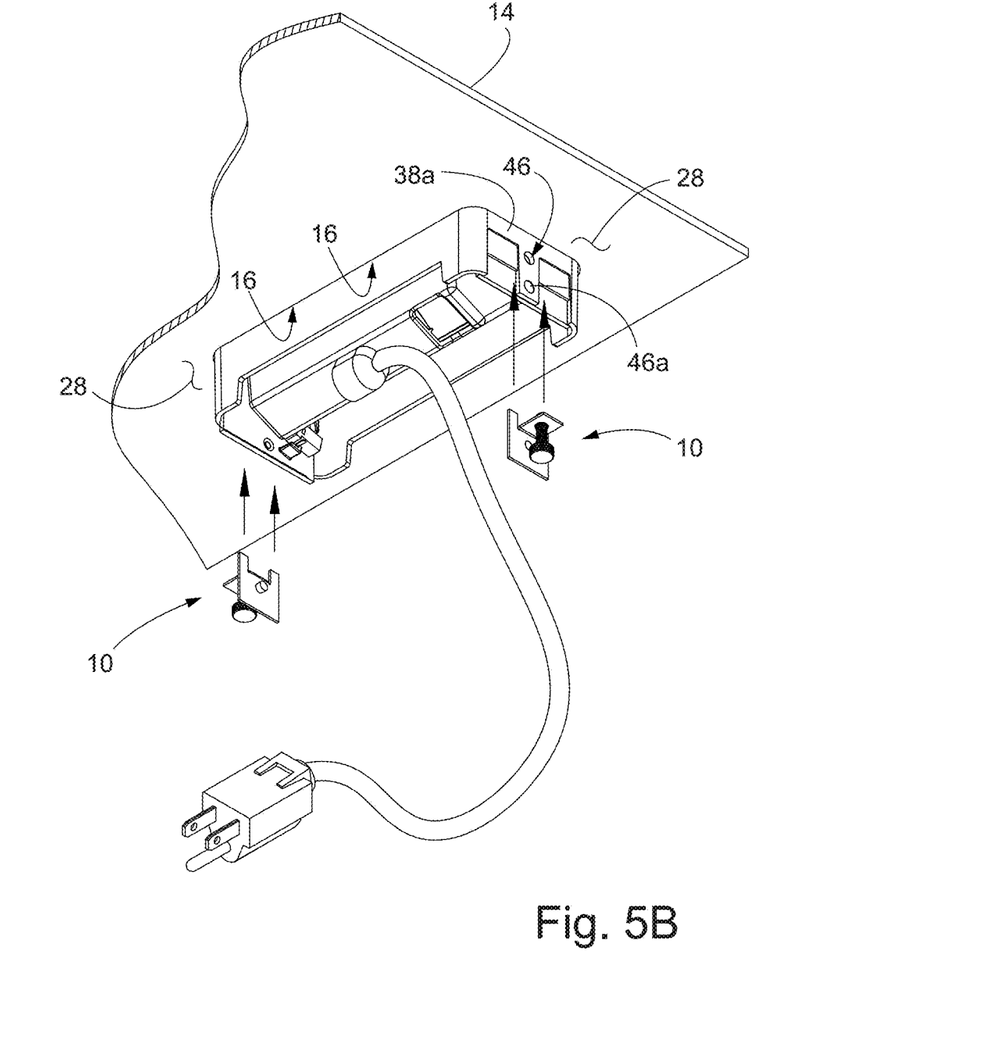
FIG. 5B is a bottom perspective view of the electrical unit positioned in the opening in the work surface of FIG. 5A, and showing a pair of clamps prior to installation.

Outwardly-extending leg 22 defines an oversized opening or bore 48 for receiving threaded shaft 26 of thumb screw 24, such as best shown in FIG. 4C. A weldnut or internally-threaded member 50 is coupled to outwardly-extending leg 22 at bore 48, and is threadingly engaged by threaded shaft 26 of thumb screw 24, such as shown in FIGS. 4A-4C. Thus, manual rotation of thumb screw 24, such as by grasping knob or gripping portion 30, will cause threaded shaft 26 to translate axially vertically relative to outwardly-extending leg 22 via its threaded engagement with weldnut 50. Although the illustrated embodiment utilizes a separate weldnut 50 for threadingly engaging threaded shaft 26, it will be appreciated that outwardly-extending leg 22 may be formed with a threaded bore in place of the oversized bore 48, so that a separate weldnut or other component is not required.

As shown with reference to FIGS. 1 and 2, clamps 10 are compatible for use with different sizes and shapes of devices 12, such as a generally rectangular power unit 12a that fits into a generally rectangular opening 16a formed in work surface 14 (FIGS. 1 and 5A-9B), or a generally circular power unit 12b that fits into a circular opening 16b formed in the work surface 14 (FIG. 2). Each power unit 12a, 12b has a substantially flat sidewall 38 against which the vertical member 20 is positioned, but it will be appreciated that the sidewall engaged by vertical member 20 of clamp 10 could be other shapes, such as convex or even somewhat concave, without substantially affecting the function of clamp 10 or its ability to secure the device 12 to a work surface. Optionally, the clamp's vertical member or portion 20 could be given an arcuate shape, or different bends or contours, to more closely conform to the shape of the sidewall of the device that it engages, if desired, and without departing from the spirit and scope of the present invention.

Figure 6:
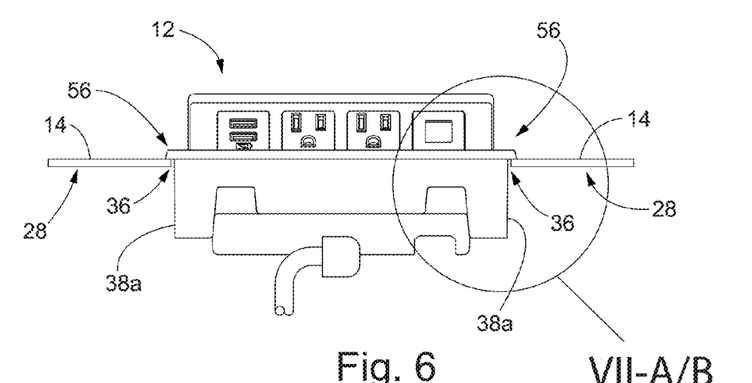
FIG. 6 is a side elevation of the power unit and work surface of FIG. 5B.

Moreover, it will be appreciated that clamp 10 may be used to secure substantially any device to a surface such as work surface 14. In the illustrated embodiments, the mounted devices 12 are electrical power units 12a, 12b having respective power cords 52 with plugs 54 configured to engage a standard electrical receptacle (not shown). Sidewalls 38a, 38b extend below surface 14 and cooperate with other surfaces of each device 12 to form a lower housing, such as shown in FIGS. 1-3. Power units or devices 12 typically include upper flanges 56 that rest atop a perimeter region of work surface 14 surrounding the opening 16 that receives the device 12, such as shown in FIGS. 5A and 6-9B. Device 12 is initially inserted into opening 16 (FIG. 5A) and is supported at work surface 14 by upper flange 56 prior to installation of the clamps (FIGS. 5B and 6). Although device 12 can be supported in this manner indefinitely, it may be susceptible to jostling and may be readily removable from opening 16 until clamps 10 are installed.

Each clamp 10 is installed by initially directing upper end portion 20a of vertical member 20 (including substantially vertical projections 32) at an oblique angle relative to device sidewall 38 and to bottom surface 28 of work surface 14, such as shown in FIG. 7A. Vertical projections 32 are inserted into space 36 as distal tip portion 26a of threaded shaft 26 and/or weld nut 50 may initially contact bottom surface 28 and unit-engaging projection 44 may initially contact sidewall 38, such as shown in FIG. 7B. To provide maximum clearance, thumb screw 24 may be retracted (lowered) a sufficient distance, prior to installation of the clamp 10, so that distal tip portion 26a does not project above weld nut 50. Optionally, thumb screw 24 may be entirely separated from body 18 until body 18 has been positioned as shown in FIG. 8. Clamp 10 is pivoted or rotated in the manner shown with a curved arrow in FIG. 7B, until vertical projections 32 are received in space 36 and projection 44 is received in opening 46 formed in device sidewall 38, such as shown in FIGS. 8-9B. Clamp 10 will tend to remain in this position, even without thumb screw 24 in position or tightened, due to the engagement of projection 44 in opening 46 and vertical projections 32 being captured between sidewall 38 and interior surface 40 that defines a portion of opening 16 formed in work surface 14.

In the position of FIG. 8-9B, body 18 will resist any attempt to lift device 12 out of opening 16 formed in work surface 14, but is made secure against jostling or unintentional removal by tightening thumb screw 24, such as in the manner indicated by a curved arrow in the enlarged portion of FIG. 8, so that distal tip portion 26a tightly engages bottom surface 28 of work surface 14. This tightening action tends to bias outwardly-extending leg 22 away from bottom surface 28, which in turn urges vertical member 20 into engagement with sidewall 38, and which also urges projection 44 into engagement with opening 46 in sidewall 38, and engages vertical projections 32 (including upper edges 42) into engagement with interior surface 40 of work surface 14. In this manner, clamp 10 provides a solid connection between device 12 and work surface 14, so that normal operation and usage of device 12 will not cause movement of the device relative to work surface 14, and to prevent unintentional removal of device 12 from work surface 14.

It will be appreciated that clamp 10 is suitable for use with substantially any device for mounting at a work surface, wall panel, or the like, and can be used to secure substantially any type of housing at an opening formed in such a surface. In addition, it will be appreciated that clamp 10 is compatible for use in securing a device having a housing that extends below the surface to which the device is mounted, or having an extension portion that extends below the surface to which the device is mounted, regardless of the thickness of the surface that receives the device. For example, in FIG. 9A, clamps 10 are used to secure a device 12 to a relatively thin work surface 14, while in FIG. 9B, the same clamps 10 are shown to be used in the same manner for securing the same device 12 to a thicker work surface 14a. However, in the case of the thicker work surface 14a, it may be necessary to use a lower opening 46a (FIGS. 1, 3, 5A, and 5B) inside wall 38 for receiving the unit-engaging projection 44.

Although it is envisioned that typical installations will use at least two clamps to secure each device, it is further envisioned that as few as one clamp may be required to suitable secure a given device to a surface, and that any number of additional clamps may be used, as desired. For example, one sidewall of a device may be provided with a surface-engaging feature, such as a lateral projection, that secures the sidewall of the device to the work surface when urged laterally into contact with the work surface. This lateral force may be provided by tightening a clamp 10 at the opposite sidewall, which secures the device at the opposite sidewall and also secures the device at the sidewall having the surface-engaging projection, so that only one clamp is required.

Because clamps 10 may be made relatively small, and typically have only one moving part and can be installed pre-assembled, it will be appreciated that the clamps are well suited for single-handed installation by first positioning the clamp as demonstrated in FIGS. 7A-8 and then rotating the thumb screw to secure the clamp in position. This may be readily accomplished without visual reference to the clamp, the underside of the work surface, or the underside of the device being secured at the opening formed in the work surface.

Accordingly, the clamp of the present invention provides a relatively inexpensive device that can be used universally to secure many different types of other devices that extend through a work surface, wall panel, or the like. The clamp can be used in small spaces that cannot readily be seen, and installs quickly and, in some embodiments, without any need for tools. Thus, electrical devices, electronic devices, or other devices can be quickly and easily installed at openings formed in surfaces, and may be secured in place but remain readily removable and replaceable by removing the clamp in the reverse order of installation, thereby freeing the device for removal as desired.

Changes and modifications in the specifically-described embodiments may be carried out without departing from the principles of the present invention, which is intended to be limited only by the scope of the appended claims as interpreted according to the principles of patent law including the doctrine of equivalents.

The invention claimed is:

1. A clamp for securing an electrical power or data unit to a mounting surface, said clamp comprising:
   a substantially vertical member configured to be positioned along a sidewall of the electrical power or data unit, said substantially vertical member comprising an end portion that is insertable between the sidewall of the electrical power or data unit and said mounting surface;
   an outwardly-extending leg that projects outwardly from said substantially vertical member, and configured to be positioned below a lower surface of the mounting surface; and
   an adjustable clamp member movably coupled to said outwardly-extending leg, said adjustable clamp member having distal and proximal end portions, said distal end portion located at or above said outwardly-extending leg and configured to engage the lower surface of the mounting surface, and said proximal end portion located opposite said distal end portion;
   wherein said adjustable clamp member is tightenable so as to engage the lower surface of the mounting surface with said distal end portion of said clamp member, thereby urging said outwardly-extending leg in a direction away from the lower surface of the mounting surface and urging said end portion of said substantially vertical member to pivot into engagement with the mounting surface.

2. The clamp of claim 1, wherein said adjustable clamp member comprises a thumbscrew having a gripping surface at said proximal end portion, said gripping surface located below said outwardly-extending leg.

3. The clamp of claim 2, wherein said outwardly-extending leg defines a threaded bore for threadedly receiving a threaded shaft portion of said adjustable clamp member.

4. The clamp of claim 1, wherein said end portion of said substantially vertical member comprises an upper portion, and said substantially vertical member further comprises a lower portion, wherein said lower portion is configured to engage the electrical power or data unit upon tightening of said adjustable clamp member.

5. The clamp of claim 1, wherein said substantially vertical member and said outwardly-extending leg are unitarily formed from a single piece of sheet metal.

6. The clamp of claim 5, wherein said substantially vertical member and said outwardly-extending leg are both substantially planar, and wherein said outwardly-extending leg is substantially perpendicular to said substantially vertical member.

7. The clamp of claim 1, further in combination with the electrical power or data unit.

8. A clamp for securing an electrical power or data unit to a mounting surface, said clamp comprising:
   a substantially vertical member configured to be positioned along a sidewall of the electrical power or data unit;
   an outwardly-extending leg that projects outwardly from said substantially vertical member, and configured to be positioned below a lower surface of the mounting surface;
   an adjustable clamp member movably coupled to said outwardly-extending leg, said adjustable clamp member having distal and proximal end portions, said distal end portion located at or above said outwardly-extending leg and configured to engage the lower surface of the mounting surface, and said proximal end portion located opposite said distal end portion;
   wherein said adjustable clamp member is tightenable so as to engage the lower surface of the mounting surface with said distal end portion of said clamp member, thereby urging said outwardly-extending leg in a direction away from the lower surface of the mounting surface and urging said substantially vertical member into securing engagement with the electrical power or data unit; and
   wherein said substantially vertical member comprises an upper portion and a lower portion, wherein said upper portion comprises an upper edge configured to engage an interior surface of the mounting surface that is spaced above the lower surface of the mounting surface, and said lower portion is configured to engage the electrical power or data unit.

9. The clamp of claim 8, wherein said upper portion of said substantially vertical member comprises a pair of substantially vertical projections each defining a respective one of said upper edges.

10. The clamp of claim 9, wherein said upper portion of said substantially vertical member defines an open space between said pair of substantially vertical projections.

11. The clamp of claim 10, wherein said substantially vertical member is substantially planar.

12. A clamp for securing an electrical power or data unit to a mounting surface, said clamp comprising:
   a substantially vertical member configured to be positioned along a sidewall of the electrical power or data unit;
   an outwardly-extending leg that projects outwardly from said substantially vertical member, and configured to be positioned below a lower surface of the mounting surface;
   a unit-engaging projection extending inwardly from said substantially vertical member in an opposite direction of said outwardly-extending leg, wherein said unit-engaging projection is configured to engage a sidewall of the electrical power or data unit;
   an adjustable clamp member movably coupled to said outwardly-extending leg, said adjustable clamp member having distal and proximal end portions, said distal end portion located at or above said outwardly-extending leg and configured to engage the lower surface of the mounting surface, and said proximal end portion located opposite said distal end portion; and wherein said adjustable clamp member is tightenable so as to engage the lower surface of the mounting surface with said distal end portion of said clamp member, thereby urging said outwardly-extending leg in a direction away from the lower surface of the mounting surface and urging said substantially vertical member into securing engagement with the electrical power or data unit.

13. The clamp of claim 12, wherein:

said substantially vertical member comprises an upper portion having an upper edge configured to engage an interior surface of the mounting surface that is spaced above the lower surface of the mounting surface;

said upper edge is configured to engage the interior surface of the mounting surface so as to resist sliding of said upper edge along the interior surface upon tightening of said adjustable clamp member; and said unit-engaging projection is configured to engage an opening formed in the sidewall of the electrical power or data unit so as to resist sliding of said substantially vertical member relative to the sidewall upon tightening of said adjustable clamp member.

14. A clamp for securing an electrical power or data unit to a mounting surface, said clamp comprising:

a substantially vertical member configured to be positioned along a sidewall of the electrical power or data unit, said substantially vertical member having an upper portion and a lower portion, wherein said upper portion is insertable between the sidewall of the electrical power or data unit and an interior surface of the mounting surface, and said lower portion is configured to engage the electrical power or data unit;

an outwardly-extending leg that projects outwardly from said substantially vertical member, and configured to be positioned below the lower surface of the mounting surface;

an adjustable clamp member movably coupled to said outwardly-extending leg, said adjustable clamp member having a distal end portion located at or above said outwardly-extending leg and configured to engage a lower surface of the mounting surface; and wherein said adjustable clamp member is tightenable against the lower surface of the mounting surface to thereby secure said clamp at the electrical power or data unit and the mounting surface by urging said upper portion of said substantially vertical member in an outward direction into engagement with the interior surface of the mounting surface and urging said lower portion of said substantially vertical member in an inward direction into securing engagement with the sidewall of the electrical power or data unit.

15. The clamp of claim 14, further comprising a unit-engaging projection extending inwardly from said lower portion of said substantially vertical member in an opposite direction of said outwardly-extending leg, wherein said unit-engaging projection is configured to engage an opening in the sidewall of the electrical power or data unit.

16. The clamp of claim 15, wherein said substantially vertical member and said outwardly-extending leg are unitarily formed from a single piece of sheet metal, and wherein said adjustable clamp member comprises a gripping surface at said proximal end portion.

17. A method of securing a power or data unit to a mounting surface, said method comprising:

positioning the power or data unit in an opening in the mounting surface, the power or data unit having sidewalls located adjacent respective interior surfaces that define the opening in the mounting surface;

inserting an upper portion of a clamp into a space defined between one of the sidewalls of the power or data unit and an adjacent one interior surface of the mounting surface;

engaging an inwardly-directed projection of the clamp with the sidewall of the power or data unit;

positioning an outwardly-extending leg of the clamp below a lower surface of the mounting surface, wherein the outwardly-extending leg is located below the upper portion of the clamp; and tightening an adjustable clamp member that is movably coupled to the outwardly-extending leg of the clamp, whereby a distal tip portion of the adjustable clamp member engages the lower surface of the mounting surface, the outwardly-extending leg is biased away from the lower surface of the mounting surface, the upper portion of the clamp is biased into engagement with the interior surface of the mounting surface, and a lower portion of the clamp is pivotably biased into engagement with the sidewall of the power or data unit.

18. The method of claim 17, wherein said inserting the upper portion of the clamp into the space comprises initially orienting the upper portion of the clamp at an insertion angle that is oblique to both the sidewall of the power or data unit and the lower surface of the mounting surface.

19. A method of securing a power or data unit to a mounting surface, said method comprising:

positioning the power or data unit in an opening in the mounting surface, the power or data unit having sidewalls located adjacent respective interior surfaces that define the opening in the mounting surface;

orienting an upper portion of a clamp at an insertion angle that is oblique to both the sidewall of the power or data unit and a lower surface of the mounting surface;

inserting the upper portion of the clamp into a space defined between the sidewall of the power or data unit and an adjacent interior surface of the mounting surface;

engaging an inwardly-directed projection of the clamp with the sidewall of the power or data unit by pivoting or rotating the clamp from the oblique insertion angle to an orientation in which the upper portion of the clamp is substantially parallel to the sidewall and substantially perpendicular to the lower surface of the mounting surface;

positioning an outwardly-extending leg of the clamp below the lower surface of the mounting surface, wherein the outwardly-extending leg is located below the upper portion of the clamp; and tightening an adjustable clamp member that is movably coupled to the outwardly-extending leg of the clamp, whereby a distal tip portion of the adjustable clamp member engages the lower surface of the mounting surface, the outwardly-extending leg is biased away from the lower surface of the mounting surface, and a lower portion of the clamp is biased into engagement with the sidewall of the power or data unit.

20. The method of claim 19, wherein said tightening the adjustable clamp member comprises manually grasping a gripping portion of the adjustable clamp member and rotating the adjustable clamp member to move the distal end portion of the adjustable clamp member into engagement with the lower surface of the mounting surface via engagement of a threaded shaft portion of the adjustable clamp member with a threaded bore formed in the outwardly-extending leg of the clamp.

* * * * *